United States Patent
Walsh et al.

(10) Patent No.: US 9,891,356 B1
(45) Date of Patent: Feb. 13, 2018

(54) SPECTRAL PURITY FILTERS (SPF), SUPPORT STRUCTURES FOR SPF FILMS AND CORRESPONDING METHODS OF MANUFACTURE

(71) Applicant: KLA-Tencor Corporation, Milpitas, CA (US)

(72) Inventors: Joseph Walsh, Soquel, CA (US); Frank Barkusky, San Jose, CA (US); Eduardo Soto, Campbell, CA (US); Sarbjit Singh Grewal, Elk Grove, CA (US); Orlando Threet, San Jose, CA (US); Gildardo Rios Delgado, Livermore, CA (US); Garry Allen Rose, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/847,875

(22) Filed: Sep. 8, 2015

Related U.S. Application Data

(60) Provisional application No. 62/048,106, filed on Sep. 9, 2014.

(51) Int. Cl.
G02B 5/20 (2006.01)
G03F 7/20 (2006.01)
G02B 7/00 (2006.01)

(52) U.S. Cl.
CPC ............. *G02B 5/203* (2013.01); *G02B 5/208* (2013.01); *G02B 7/006* (2013.01); *G03F 7/708* (2013.01); *G03F 7/70191* (2013.01)

(58) Field of Classification Search
CPC ........ G02B 5/0891; G02B 5/20; G02B 5/204; G02B 5/208; G02B 5/22; G02B 7/006; G03F 7/7015; G03F 7/70191; G03F 7/70308
USPC ............... 359/359, 350, 360, 361, 885, 892; 355/67, 71

See application file for complete search history.

(56) References Cited

U.S. PATENT DOCUMENTS

2011/0309271 A1* 12/2011 Moriya ............... G03F 7/70191
250/504 R

* cited by examiner

*Primary Examiner* — Arnel C Lavarias
(74) *Attorney, Agent, or Firm* — Suiter Swantz pc llo

(57) ABSTRACT

A device includes spectral purity filters (SPF) and structures for supporting SPF films. The device further includes a monolithic support having a mesh portion and a frame portion and a film overlaying at least a portion of the support. In some cases, the film can be affixed to the support without an adhesive. The monolithic support can be Silicon, stainless steel or some other suitable material and the film can be a single layer spectral purity filter film or a multilayer spectral purity filter film. The mesh portion of the support can include a plurality of through-holes that are formed by etching and/or eroding a thinned material such as silicon or stainless steel.

42 Claims, 4 Drawing Sheets

SPECTRAL PURITY FILTERS (SPF), SUPPORT STRUCTURES FOR SPF FILMS AND CORRESPONDING METHODS OF MANUFACTURE

PRIORITY

The present application claims priority under 35 U.S.C. 119(e) to U.S. Provisional Patent Application Ser. No. 62/048,106, titled "Use Of Special Support Structures For Spectral Purity Filters In The EUV Range", by Joseph Walsh et al., filed Sep. 9, 2014. The above-referenced provisional patent application is hereby incorporated by reference in its entirety.

TECHNICAL FIELD

The present disclosure relates generally to spectral purity filters (SPF) and structures for supporting SPF films. SPF embodiments described herein can be substantially transmissive of radiation in the extreme ultraviolet (EUV) range (i.e. light having a wavelength in the range of 10 nm-124 nm and including light having a wavelength of 13.5 nm) and substantially non-transmissive of infrared radiation (i.e. light having a wavelength in the range of 700 nm-1 mm and including light having a wavelength of 1 µm). Some of the embodiments described herein are particularly suitable for use in ultraclean vacuum environments. Applications of the SPF filters described herein can include, but are not limited to, use in EUV actinic mask inspection, EUV metrology devices and in EUV lithography equipment (e.g. steppers/scanners) for patterning chips.

BACKGROUND

Typical EUV sources for lithography and inspection tools are based on plasma formation which result in radiation emission over a broad spectral range from about 5 nm to the infrared (IR). EUV mirrors based on Molybdenum and Silicon multilayers reflect not only EUV, but also radiation above about 100 nm. This so called "out-of-band" radiation can lead to reduced resolution or increased noise floor on the detector. For these reasons, it is often desirable to reduce or remove the "out-of-band" radiation from the useable EUV radiation before the useable radiation reaches the sample or the detector. In addition, the presence of "out-of-band" vacuum ultraviolet (VUV) and ultraviolet (UV) radiation can lead to increased oxidation as well as carbon and inorganic contamination growth on exposed surfaces. This oxidation and contamination can limit the lifetime of components such as mirrors and detectors.

For the reasons cited above, spectral purity filters based on thin metal films are often used to suppress unwanted radiation. These thin metal films usually have thicknesses in the range between 8-200 nm and can have apertures of several centimeters in diameter. Conventional spectral purity filters based on thin films are either free-standing or supported by a mesh.

Freestanding SPF filters usually have thicknesses in the 100-200 nm range. As a result, they are extremely fragile and can be sensitive to gas flows and pressure differences. For some EUV tool designs, gas flows are used for suppressing contaminant movement and particle protection. Also, for these EUV tools, pressure differences can be generated during initial vacuum pump down. In some cases, these gas flows and pressure differences can lead to a failure of the fragile SPF filter. A failure here can lead to an immediate, complete destruction of the filter, generating particles that can spread and contaminate the tool environment.

Heretofore, supported filters have typically been made by attaching a thin SPF film to a relatively thin (usually Ni) mesh. In order to maximize transmission through the SPF filter, a conventional mesh typically has a large ratio of open area to area blocked by the mesh structure, such as 1 mm openings and wire diameters in the $10^{th}$ of micrometer scale. The supported filters generally use special adhesives for affixing the mesh to a frame. However, these adhesives can outgas in vacuum environments. This can increase the contaminant level inside an EUV tool, reducing the optics and detectors, for example, due to carbon contamination.

Generally, tools that use EUV light operate in an ultra-clean vacuum environment and in the presence of gasses, such as $H_2$, Argon and/or other possible gas species. In this environment, acceptable material choices are very restricted. Only certain types of metals and very few types of other materials qualify to be low outgassing with qualified clean procedures. In addition, the chosen materials may need to withstand exposure to EUV radiation and withstand exposure to reactive Argon, $H_2O$ and hydroxides and hydrogen species (neg and pos Hydrogen and atomic Hydrogen). For example, the use of cables or adhesives can lead to contaminants (mainly Hydrocarbons in the gas phase) inside the chamber and can lead to particulation. It is also known that the interaction of EUV light with contaminants can generate layers of contaminants (e.g. Carbon) on surfaces. This effect is more pronounced on surfaces that are actually exposed to EUV radiation, e.g. mirrors. Here, contamination can cause a reflectivity drop and can cause a phase change of the incident radiation. Both of these effects can degrade the optics over time, and in some cases lead to a failure of the optical system.

With the above in mind, Applicants disclose Spectral Purity Filters (SPF), Support Structures for SPF Films and Corresponding Methods for Manufacture.

SUMMARY

In a first aspect, a device is disclosed that includes a monolithic support having a mesh portion and a frame portion and a film overlaying at least a portion of the support.

In one embodiment of this aspect, the film is affixed to the support without an adhesive and in a particular embodiment the film is affixed to the support by van der Waals forces.

In a particular embodiment, the frame portion of the support surrounds the mesh portion of the support.

For this aspect, the monolithic support can be silicon, stainless steel or some other suitable material and the film can be a single layer spectral purity filter film or a multilayer spectral purity filter film. For example, the film can be substantially transmissive for incident radiation within a first band around a first wavelength and substantially non-transmissive for incident radiation within a second band around a second wavelength. In a particular embodiment, the first wavelength is in a range between 10 nm-124 nm and the second wavelength is in a range between 700 nm-1 mm.

In one particular embodiment, the mesh can be formed with a plurality of apertures that are sized to establish a grating that is substantially non-dispersant for incident radiation within a first band around a first wavelength and substantially dispersant for incident radiation within a second band around a second wavelength. In a particular embodiment, the first wavelength is in a range between 10 nm-124 nm and the second wavelength is in a range between 700 nm-1 mm.

In another aspect, a spectral purity filter is disclosed that is prepared by a process including the steps of forming a plurality of through-holes in a material to establish a monolithic support having a mesh portion and a frame portion, and overlaying at least a portion of the monolithic support with a film.

For this aspect, the process can further include the step of thinning the material. For example, the thinning step can be performed before the step of forming a plurality of through-holes and can be accomplished by etching, eroding and/or mechanical thinning techniques.

In a particular implementation of this aspect, the forming step can be accomplished by etching and/or eroding.

In another aspect, a method for manufacturing a spectral purity filter is disclosed and includes the steps of forming a plurality of through-holes in a material to establish a monolithic support having a mesh portion and a frame portion, and overlaying at least a portion of the monolithic support with a film.

For this aspect, the method can further include the step of thinning the material. For example, the thinning step can be performed before the step of forming a plurality of through-holes and can be accomplished by etching, eroding and/or mechanical thinning techniques.

In a particular implementation of this method, the forming step can be accomplished by etching and/or eroding.

It is to be understood that both the foregoing general description and the following detailed description are exemplary and explanatory only and are not necessarily restrictive of the present disclosure. The accompanying drawings, which are incorporated in and constitute a part of the specification, illustrate the subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
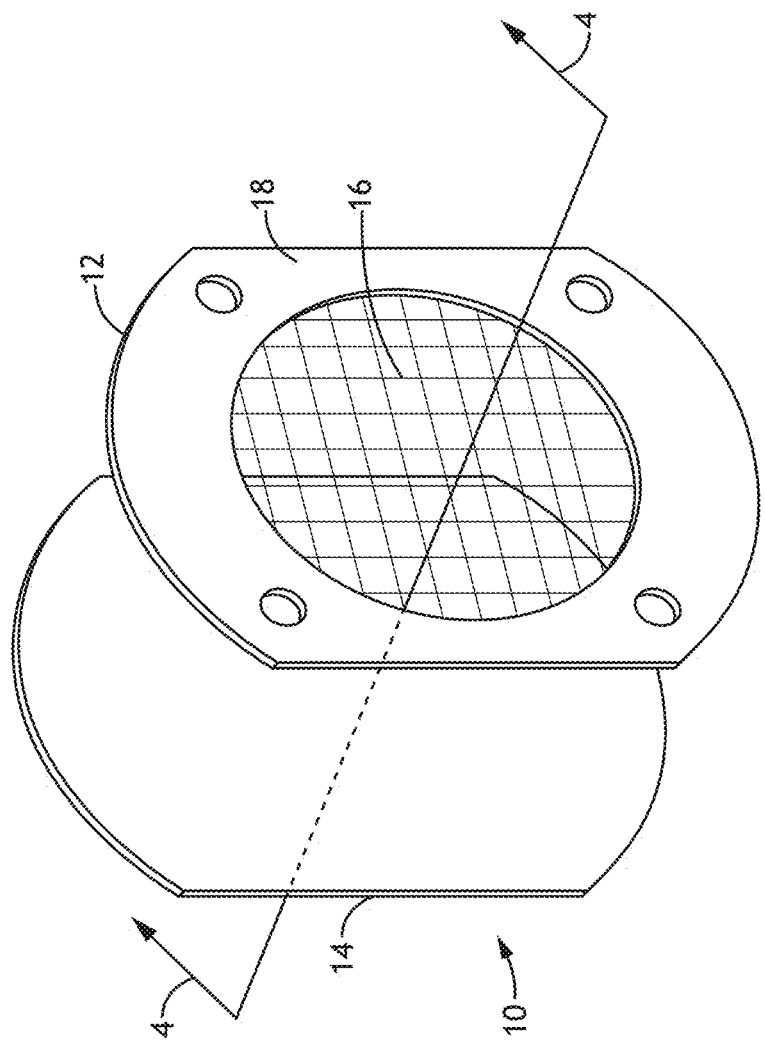
FIG. 1 is an exploded, perspective view of a spectral purity filter in accordance with an embodiment of this disclosure.

FIG. 1 shows an exploded, perspective view of a spectral purity filter (generally designated 10) in accordance with an embodiment of this disclosure. As shown, the spectral purity filter 10 includes a monolithic support 12 and a spectral purity filter film 14. As used herein, the term "monolithic" means a structure that is formed or composed of material without joints or seams. Continuing with reference to FIG. 1, it can be seen that the support 12 includes a mesh portion 16 and a frame portion 18. For the FIG. 1 embodiment, the frame portion 18 of the support 12 surrounds the mesh portion 16 of the support 12.

For the spectral purity filter 10 shown in FIG. 1, the support can be Stainless Steel, such as 304 Stainless Steel, Aluminum with low trace elements, Platinum, Silicon, Silicon Nitride, Bronze, Invar or another suitable material. Material selection can include considerations of EUV transmission, outgassing, thermal expansion and resistance to specific reactive species within the vacuum environment. For example, Silicon at a thickness of 200 nm still has an EUV transmission of 70%. Also, for the spectral purity filter 10 shown in FIG. 1, the film 14 can be, for example, a single layer spectral purity filter film, for example, a film made of Yttrium, Silicon, Zirconium, Niobium, Beryllium, Ruthenium, Boron or Tantalum Nitride, or a multilayer spectral purity filter film such as multilayer Zr/Si, or a multilayer having Ruthenium, Boron and/or Tantalum Nitride. For example, a 1000 Angstrom single layer Zirconium film that has been produced by vacuum deposition may be suitable for some applications. In more functional terms, the film 14 can be substantially transmissive for incident radiation 4 within a first band around a first wavelength and substantially non-transmissive for incident radiation 4 within a second band around a second wavelength. For example, the film 14 may be selected such that the first wavelength is in a range between 10 nm-124 nm (EUV) and the second wavelength is in a range between 700 nm-1 mm (IR).

Figure 2:
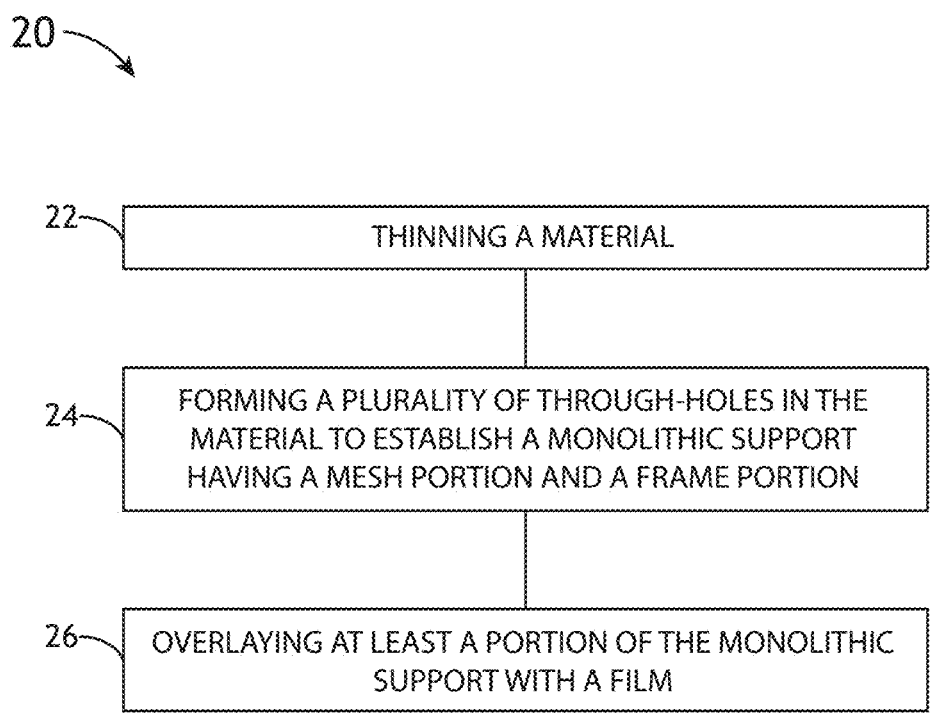
FIG. 2 is a flowchart showing process/method steps for preparing a spectral purity filter.
Figure 3B:
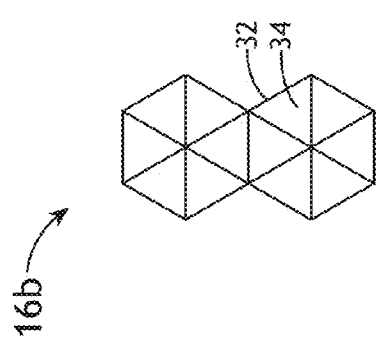
FIGS. 3A-3D show suitable mesh patterns for spectral purity filters in accordance with an embodiment of this disclosure.
Figure 3D:
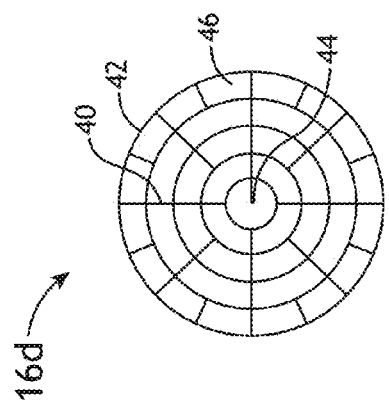
Figure 3A:
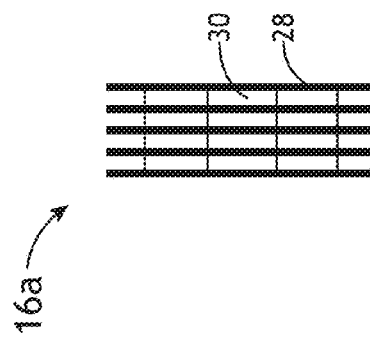
Figure 3C:
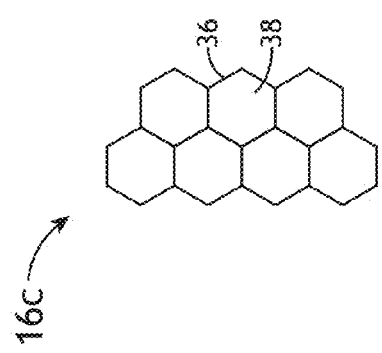

FIG. 2 shows a sequence of process/method steps (generally designated 20) for preparing a spectral purity filter 10. As shown, the process can start by thinning a material (box 22), e.g. to a thickness, "t" (see FIG. 4). In some cases, the material may be thinned to a thickness of about 30 μm. For example, the thinning step can be accomplished by etching, eroding and/or mechanical thinning techniques such as cutting, lapping and/or grinding. Next, as shown in FIG. 2, a plurality of through-holes can be formed in the thinned material (box 24) to establish the mesh portion 16 of a monolithic support 12 (see FIG. 1). This forming step can be accomplished by etching and/or eroding the thinned material. For example, the etching step may be part of a conventional lithography process in which the thin material is patterned with the through-holes. For example, processes such as "Deep Reactive Ion Etching", dry process, plasma edging, etc. may be used in some implementations.

Continuing with reference to FIG. 2, it can be seen that after forming the through-holes in the thinned material, the step of overlaying at least a portion of the monolithic support 12 with a film 14 (box 26) can occur. In some cases, this step can involve a direct contact between the film 14 and surface(s) of the frame portion 18 (or some portions thereof) and/or the mesh portion 16 (or some portion thereof). The film 14 (see FIG. 1) can be affixed to the support 12 by adhesive bonding, mechanical attachment, e.g. fastener(s), or by van der Waals forces. However, as indicated above, it may be advantageous to affix the film 14 to the support 12 without an adhesive (i.e. to prevent contamination within an ultraclean vacuum environment due to adhesive outgassing). For the case where the film 14 is affixed to the support by van der Waals forces, the extent of the van der Waals forces established may be affected by the contact area between the film 14 and support 12, the surface finish of the support 12, the flatness of the support 12, and the materials chosen for the support 12 and film 14.

The above described method/process is flexible and can allow the opening ratio, mesh geometry, and supportive mesh structure to be optimized to the properties of the tool. In some cases, the above described method/process can result in a higher transmissive support 12 as compared with conventional methods. In addition, this process/method can, in some implementations, achieve a very plane and flat mesh/frame surface making it possible to use even thinner transmissive filters, therefore increasing transmission and reducing scan-time on the tool. In some instances, the above described method/process makes it possible to use materials for support that are optimized for the vacuum environment, such as 304 stainless steel and Silicon, can be well controlled and can result in a lower cost assembly.

FIGS. 3A-3D show suitable mesh patterns for a spectral purity filter 10. More specifically, for the pattern shown in FIG. 3A, straight, spaced apart, parallel walls 28 establish a mesh 16a having rectangle shaped apertures 30. For the pattern shown in FIG. 3B, a hexagonal mesh 16b can be formed with walls 32 arranged to establish triangle shaped apertures 34. For the pattern shown in FIG. 3C, a hexagonal mesh 16c can be formed with walls 36 arranged to establish hexagon shaped apertures 38. For the pattern shown in FIG. 3D, a mesh 16d can be formed with straight walls 40 and circular walls 42 that are arranged to establish a pattern having circle shaped apertures 44 and partial ring shaped apertures 46.

Figure 4:
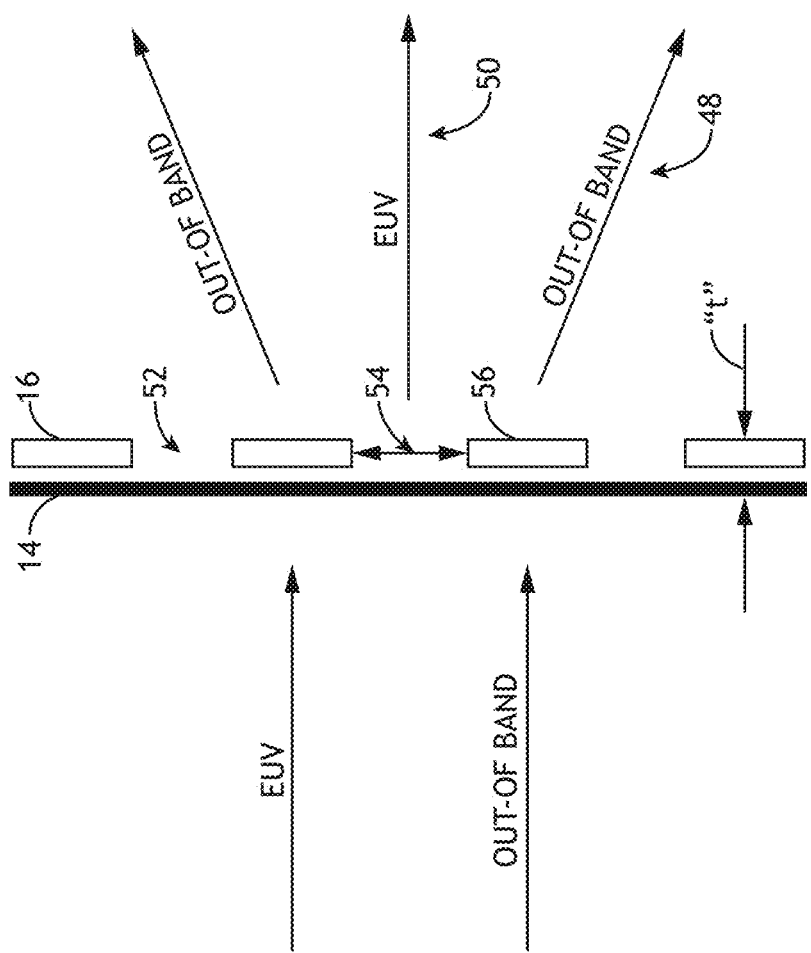
FIG. 4 is a sectional view of a portion of the spectral filter as seen along line 4-4 in FIG. 1 illustrating a mesh configured to be dispersant for out of band radiation and non-dispersant for in band radiation.

FIG. 4 shows a mesh portion 16 that is configured to be dispersant for out-of-band radiation 48 and non-dispersant for in-band radiation (i.e. EUV 50). In particular, the mesh portion 16 can be formed with a plurality of apertures 52 having a size represented by distance 54 between mesh walls 56 to establish a grating. As illustrated by FIG. 4, the grating can be sized (i.e. tuned) to be substantially non-dispersant for incident radiation within a first band around a first wavelength and substantially dispersant for incident radiation within a second band around a second wavelength. In particular, the first wavelength can be in a range between 10 nm-124 nm, such as 13.5 nm, and the second wavelength can be in a range between 125 nm-1 mm, and can be, for example VUV, UV or IR. The use of a grating in this manner can, in some cases, result in an implementation having a thinner SPF film 14 for general out-of-band suppression, which in turn, can result in greater in-band transmission.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed is:

1. A device comprising:
   a monolithic support formed from a single piece of a material suitable for use in a vacuum environment, wherein the monolithic support includes a planar mesh portion including a plurality of through-holes formed in the single piece of the material and a frame portion surrounding the planar mesh portion; and
   a film disposed on at least a portion of the monolithic support, wherein the planar mesh portion is configured to transmit radiation incident on the monolithic support.

2. A device as recited in claim 1 wherein the film is affixed to the support without an adhesive.

3. A device as recited in claim 1 wherein the film is affixed to the support by van der Waals forces.

4. A device as recited in claim 1 wherein the monolithic support is Silicon.

5. A device as recited in claim 1 wherein the monolithic support is stainless steel.

6. A device as recited in claim 1 wherein the film is a single layer spectral purity filter film.

7. A device as recited in claim 1 wherein the film is a multilayer spectral purity filter film.

8. A device as recited in claim 1 wherein the film is a spectral purity filter film transmissive for incident radiation within a first band around a first wavelength and non-transmissive for incident radiation within a second band around a second wavelength.

9. A device as recited in claim 8 wherein the first wavelength is in a range between 10 nm-124 nm and the second wavelength is in a range between 700 nm-1 mm.

10. A device as recited in claim 1 wherein the mesh is formed with a plurality of apertures sized to be non-dispersant for incident radiation within a first band around a first wavelength and dispersant for incident radiation within a second band around a second wavelength.

11. A device as recited in claim 10 wherein the first wavelength is in a range between 10 nm-124 nm and the second wavelength is in a range between 700 nm-100 μm.

12. A device as recited in claim 1 wherein the frame portion surrounds the mesh portion.

13. A spectral purity filter prepared by a process comprising the steps of:
   forming a plurality of through-holes in a single piece of a material suitable for use in a vacuum environment to establish a monolithic support having a planer mesh portion and a frame portion surrounding the planar mesh portion, wherein the planar mesh portion is configured to transmit radiation incident on the monolithic support; and
   overlaying a film on at least a portion of the monolithic support.

14. A spectral purity filter as recited in claim 13 further comprising the step of thinning the material.

15. A spectral purity filter as recited in claim 13 wherein the forming step is accomplished by etching.

16. A spectral purity filter as recited in claim 13 wherein the forming step is accomplished by eroding.

17. A spectral purity filter as recited in claim 13 wherein the film is affixed to the support without an adhesive.

18. A spectral purity filter as recited in claim 13 wherein the film is affixed to the support by van der Waals forces.

19. A spectral purity filter as recited in claim 13 wherein the monolithic support is Silicon.

20. A spectral purity filter as recited in claim 13 wherein the monolithic support is stainless steel.

21. A spectral purity filter as recited in claim 13 wherein the film is a single layer spectral purity filter film.

22. A spectral purity filter as recited in claim 13 wherein the film is a multilayer spectral purity filter film.

23. A spectral purity filter as recited in claim 13 wherein the film is a spectral purity filter film transmissive for incident radiation within a first band around a first wavelength and non-transmissive for incident radiation within a second band around a second wavelength.

24. A spectral purity filter as recited in claim 23 wherein the first wavelength is in a range between 10 nm-124 nm and the second wavelength is in a range between 700 nm-1 mm.

25. A spectral purity filter as recited in claim 13 wherein the mesh is formed with a plurality of apertures sized to be non-dispersant for incident radiation within a first band around a first wavelength and dispersant for incident radiation within a second band around a second wavelength.

26. A spectral purity filter as recited in claim 25 wherein the first wavelength is in a range between 10 nm-124 nm and the second wavelength is in a range between 700 nm-100 μm.

27. A spectrul purity filter as recited in claim 13 wherein the frame portion surrounds the mesh portion.

28. A method for manufacturing a spectral purity filter comprising the steps of:
forming a plurality of through-holes in a single piece of a material suitable for use in a vacuum environment to establish a monolithic support having a planar mesh portion and a frame portion surrounding the planar mesh portion, wherein the planar mesh portion is configured to transmit radiation incident on the monolithic support; and
overlaying a film on at least a portion of the monolithic support.

29. A method as recited in claim 28 further comprising the step of thinning the material.

30. A method as recited in claim 28 wherein the forming step is accomplished by etching.

31. A method as recited in claim 28 wherein the forming step is accomplished by eroding.

32. A method as recited in claim 28 wherein the film is affixed to the support without an adhesive.

33. A method as recited in claim 28 wherein the film is affixed to the support by van der Waals forces.

34. A method as recited in claim 28 wherein the monolithic support is Silicon.

35. A method as recited in claim 28 wherein the monolithic support is stainless steel.

36. A method as recited in claim 28 wherein the film is a single layer spectral purity filter film.

37. A method as recited in claim 28 wherein the film is a multilayer spectral purity filter film.

38. A method as recited in claim 28 wherein the film is a spectral purity filter film transmissive for incident radiation within a first band around a first wavelength and non-transmissive for incident radiation within a second band around a second wavelength.

39. A method as recited in claim 38 wherein the first wavelength is in a range between 10 nm-124 nm and the second wavelength is in a range between 700 nm-1 mm.

40. A method as recited in claim 28 wherein the mesh is formed with a plurality of apertures sized to be non-dispersant for incident radiation within a first band around a first wavelength and dispersant for incident radiation within a second band around a second wavelength.

41. A method as recited in claim 40 wherein the first wavelength is in a range between 10 nm-124 nm and the second wavelength is in a range between 700 nm-100 μm.

42. A method as recited in claim 28 wherein the frame portion surrounds the mesh portion.

* * * * *